US012567454B2

(12) United States Patent
Wang et al.

(10) Patent No.: US 12,567,454 B2
(45) Date of Patent: Mar. 3, 2026

(54) PRE-CHARGE VOLTAGE GENERATION CIRCUIT FOR RANDOM ACCESS MEMORY

(71) Applicant: GigaDevice Semiconductor Inc., Beijing (CN)

(72) Inventors: Meifeng Wang, Beijing (CN); Miaomiao Wu, Beijing (CN)

(73) Assignee: GigaDevice Semiconductor Inc., Beijing (CN)

( * ) Notice: Subject to any disclaimer, the term of this patent is extended or adjusted under 35 U.S.C. 154(b) by 183 days.

(21) Appl. No.: 18/234,881

(22) Filed: Aug. 17, 2023

(65) Prior Publication Data

US 2024/0257859 A1     Aug. 1, 2024

(30) Foreign Application Priority Data

Jan. 30, 2023     (CN) .......................... 202310118408.8

(51) Int. Cl.
| | |
|---|---|
| *G11C 7/06* | (2006.01) |
| *G11C 11/4074* | (2006.01) |
| *G11C 11/4091* | (2006.01) |
| *G11C 11/4094* | (2006.01) |
| *G11C 11/4096* | (2006.01) |

(52) U.S. Cl.
CPC ...... *G11C 11/4074* (2013.01); *G11C 11/4091* (2013.01); *G11C 11/4094* (2013.01); *G11C 11/4096* (2013.01)

(58) Field of Classification Search
CPC ............ G11C 11/4074; G11C 11/4091; G11C 11/4094; G11C 11/4096; G11C 7/06; G11C 7/1048; G11C 7/1051
See application file for complete search history.

(56) References Cited

U.S. PATENT DOCUMENTS

| | | | | |
|---|---|---|---|---|
| 2007/0091703 A1* | 4/2007 | Nishimura | ........ | G11C 11/40626 365/212 |
| 2007/0296602 A1* | 12/2007 | Matano | ............ | G01R 31/31721 340/635 |
| 2012/0314483 A1* | 12/2012 | Tsukada | .................. | G11C 11/39 365/207 |
| 2013/0070540 A1* | 3/2013 | Pyeon | .................... | G11C 5/147 327/564 |
| 2013/0193507 A1* | 8/2013 | Yoshida | ............... | H10D 84/038 257/E27.06 |
| 2015/0213856 A1* | 7/2015 | Park | ..................... | G11C 7/1048 365/203 |
| 2018/0114550 A1* | 4/2018 | Cho | ..................... | G11C 11/4076 |

FOREIGN PATENT DOCUMENTS

KR          100569564 B1     4/2006

* cited by examiner

*Primary Examiner* — Mushfique Siddique

(57) ABSTRACT

Pre-charge voltage generation circuit for a random memory and a random memory are provided. The pre-charge voltage generation circuit is configured to selectively provide a pre-charge voltage and includes: a voltage generation module, configured to generate a first voltage and a second voltage, wherein either of the first voltage and the second voltage serves as the pre-charge voltage, the first voltage is greater than the second voltage; a selection module, coupled to the voltage generation module, configured to select and output the second voltage as the common end voltage of the storage capacitor of the random memory in response to an operation command being a write command, and configured to select and output the first voltage as the common end voltage in response to the operation command being a read command.

18 Claims, 8 Drawing Sheets

80

82

80

PRE-CHARGE VOLTAGE GENERATION CIRCUIT FOR RANDOM ACCESS MEMORY

CROSS REFERENCE TO RELATED APPLICATIONS

The present application claims priority of Chinese Patent Application No. 202310118408.8, filed on Jan. 30, 2023, the entire contents of which are hereby incorporated by reference in their entireties.

TECHNICAL FIELD

The present disclosure relates to the field of memories, and in particular to a pre-charge voltage generation circuit for a random memory and a random memory.

BACKGROUND

A storage array of a memory includes a plurality of word lines (WL), a plurality of bit lines (BL), and a plurality of storage units. Each storage unit is connected to one of the plurality of word lines and one of the plurality of bit lines. Usually, one storage unit includes one access switch and one storage capacitor. The word line controls the access switch to be turned on or turned off to allow or disallow information stored in the storage capacitor to be read or to be rewritten. The bit line is the only access to the storage capacitor. When the access switch is turned on, a reading operation or a writing operation can be performed on the storage capacitor via the bit line.

When performing the reading operation or the writing operation on data in the storage unit, whether the storage unit storing data "1" or data "0" is determined based on the amount of charges in the storage unit. Therefore, whether the data being the "1" or the "0" is determined based on the amount of charges being read from the storage unit. The applicant has found, after long-term research, that while performing the writing operation, the single kind of the pre-charge voltage of a bit line may not properly ensure the charges in the storage capacitor corresponding to the writing operation, such that the data that is read in the reading operation may be inaccurate.

SUMMARY OF THE DISCLOSURE

According to a first aspect, a pre-charge voltage generation circuit configured for a random memory is provided. The pre-charge voltage generation circuit is configured to selectively provide a pre-charge voltage and includes: a voltage generation module, configured to generate a first voltage and a second voltage, wherein the first voltage or the second voltage is configured to serve as a pre-charge voltage, and the first voltage is greater than the second voltage; and a selection module, coupled to the voltage generation module, wherein the selection module is configured to select and output, in response to an operation command being a write command, the second voltage as a voltage of a common end of at least one storage capacitor of the random memory, and is configured to select and output, in response to the operation command being a read command, the first voltage as the voltage of the common end.

According to a second aspect, a random memory, comprising the pre-charge voltage generation circuit as described in the first aspect.

BRIEF DESCRIPTION OF THE DRAWINGS

In order to illustrate technical solutions in embodiments of the present disclosure more clearly, the accompanying drawings used for describing the embodiments are described in brief in the following. Apparently, the following drawings are only some of the embodiments of the present disclosure, any ordinary skilled person in the art may obtain other drawings based on these drawings without any creative work.

DETAILED DESCRIPTION

Figure 1:
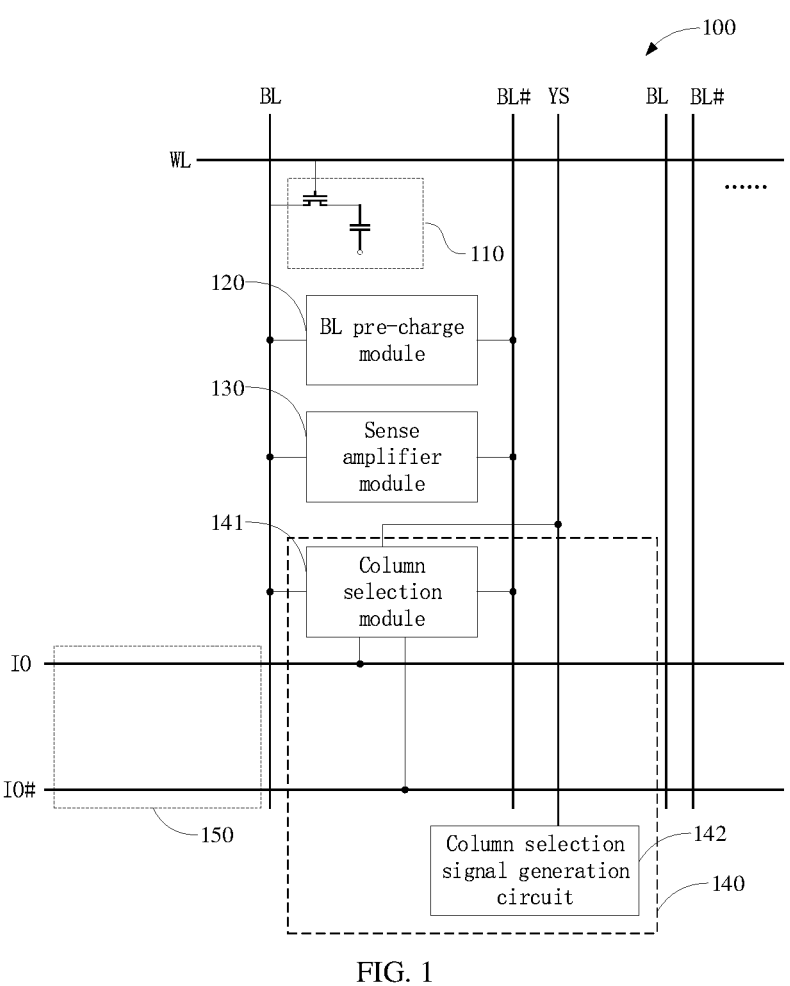
FIG. 1 is a structural schematic view of a storage array of a random memory according to an embodiment of the present disclosure.

Technical solutions in the embodiments of the present disclosure will be clearly and completely described below by referring to the accompanying drawings in the embodiments of the present disclosure. It will be understood that any specific embodiment described herein is only for the purpose of explaining the present disclosure and shall not be interpreted as a limitation of the present disclosure. To be noted that, for description purposes, only a part, but not the entire, structure relevant to the present disclosure is shown in the drawings. All other embodiments obtained by any ordinary skilled person in the art, based on the embodiments in the present disclosure without creative work, shall fall within the scope of the present disclosure.

The "embodiments" herein means that a particular feature, a particular structure or a particular property described in an embodiment may be included in at least one embodiment of the present disclosure. The presence of the term in various sections in the specification does not necessarily mean one same embodiment, nor is it a separate or an alternative embodiment that is mutually exclusive with other embodiments. Any ordinary skilled person in the art shall explicitly and implicitly understand that the embodiments described herein may be combined with other embodiments.

As shown in FIG. 1, FIG. 1 is a structural schematic view of a storage array of a random memory according to an embodiment of the present disclosure. The storage array 100 includes a plurality of word lines (WL), a plurality of bit lines (BL), and a plurality of storage units 110. Each of the plurality of storage units 110 is connected to one word line WL of the plurality of word lines and one bit line BL of the plurality of bit lines.

In an embodiment, the random memory may be a dynamic random access memory (DRAM). Each storage unit 110 includes one access switch and one storage capacitor. The storage capacitor indicates "1" and "0" in logic based on the amount of charges stored in the storage capacitor or based on a high and a low voltage difference between two ends of the storage capacitor. The access switch being turned-on or turned-off determines whether information stored in the storage capacitor is allowed or disallowed to be read or rewritten.

In detail, the word line WL determines whether the access switch is turned-on or turned-off. The bit line BL is the only access to the storage capacitor. When the access switch is turned-on, reading or writing operation can be performed on the storage capacitor via the bit line BL.

In an embodiment, a common end of the storage capacitor is connected at an initialization potential Vblp (for example, the initialization potential Vblp=Vary/2).

When the information stored in the storage capacitor is "1", and a voltage at the other end of the storage capacitor is Vary, the amount of charges stored in the storage capacitor is:

$$Q = +\text{Vary}/2 * C.$$

When the information stored in the storage capacitor is "0", and the voltage at the other end of the storage capacitor is 0, the amount of charges stored in the storage capacitor is:

$$Q = -\text{Vary}/2 * C.$$

Furthermore, the storage array 100 further includes a bit-line pre-charge module 120, a sense amplifier module 130, a column selection circuit 140, and an input-output circuit 150.

It needs to be noted that, two adjacent bit lines BL may be referenced to each other, and the plurality of bit lines may serve as a plurality of pairs of complementary bit lines. (each pair includes a target bit line BL and a complementary bit line BL # complementary with the target bit line BL). In particular, the bit-line pre-charge module 120 is connected to one pair of complementary bit lines (BL/BL #), such that, in a pre-charge stage, the bit-line pre-charge module 120 may charge the target bit line BL and the complementary bit line BL # to the initialization potential Vblp. The sense amplifier module 130 is connected to one pair of complementary bit lines (BL/BL #), such that when the storage unit 110 connected to the target bit line BL is switched on by the word line WL, sense amplifier module 130 may amplify a logic potential on the target bit line BL to reach a corresponding strong potential. The input-output circuit 150 includes a pair of complementary input-output lines (IO/IO #). The column selection circuit 140 includes a plurality of column selection modules 141 and a column selection signal generation circuit 142. Each column selection module 141 is connected to one pair of complementary bit lines to determine, based on a corresponding column selection signal generated by the column selection signal generation circuit 142, whether the current pair of complementary bit lines is selected to be conducted with the connected pair of complementary input-output lines (IO/IO #).

Figure 2:
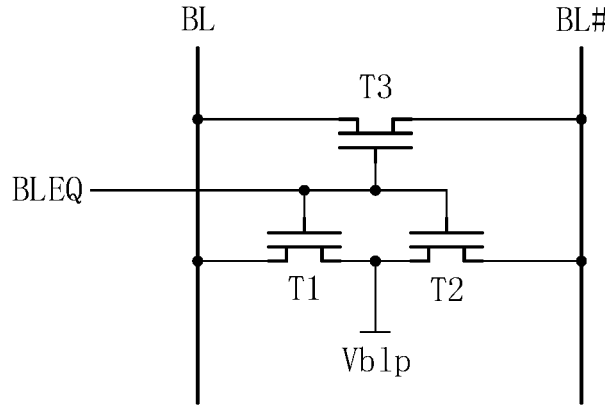
FIG. 2 is a structural schematic view a bit-line pre-charge module shown in FIG. 1.

As shown in FIG. 2, FIG. 2 is a structural schematic view the bit-line pre-charge module shown in FIG. 1. The bit-line pre-charge module 120 includes a switch T1, a switch T2, and a switch T3. A control terminal of the switch T1, a control terminal of the switch T2, and a control terminal of the switch T3 receive a pre-charge control signal BLEQ. A first conduction terminal of the switch T1 is connected to the target bit line BL, and a first conduction terminal of the switch T2 is connected to the complementary bit line BL #. A second conduction terminal of the switch T1 and a second conduction terminal of the switch T2 are connected to the initialization potential Vblp. A first conduction terminal of the switch T3 is connected to the target bit line BL, and a second conduction terminal of the switch T3 is connected to the complementary bit-line BL #.

In the pre-charge stage, the pre-charge control signal BLEQ controls the switch T1 and the switch T2 to be turned on (conducted) and charge the target bit line BL and the complementary bit line BL # through the initialization potential Vblp. In this way, potentials of the target bit line BL and the complementary bit line BL # are initialized to be the initialization potential Vblp. Further, the pre-charge control signal BLEQ controls the switch T3 to be turned on (conducted), such that the potential of the target bit line BL is equal to the potential of the complementary bit line BL #.

In some embodiments, each of the above-mentioned switch T1, the switch T2, and the switch T3 may be an nMOS transistor, but the present disclosure does not limit the type of the transistor, the switch may alternatively be a transistor in another type.

Figure 3:
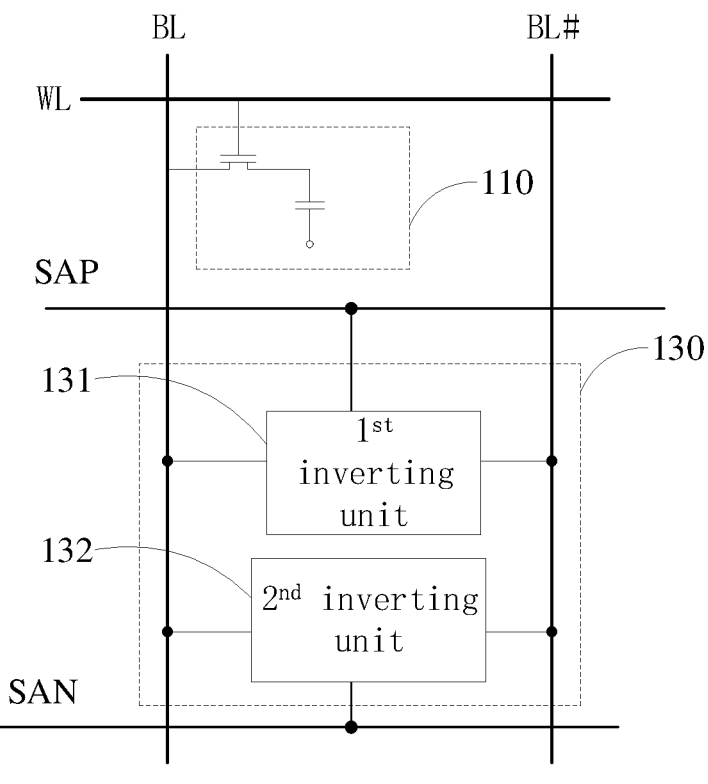
FIG. 3 is a structural schematic view of a sense amplifier module shown in FIG. 1.

As shown in FIG. 3, FIG. 3 is a structural schematic view of the sense amplifier module shown in FIG. 1. The sense amplifier module 130 includes a first inverting unit 131 and a second inverting unit 132.

The first inverting unit 131 is arranged between and connected with the target bit line BL and the complementary bit line BL #. When the storage unit 110 connected to the target bit line BL is turned-on (conducted), a target bit line voltage $V_{BL}$ on the target bit line BL is shifted from the initialization potential Vblp based on a logic voltage level stored in the storage unit 110. The first inverting unit 131 is flipped, based on the target bit line voltage $V_{BL}$ being shifted upward or downward, to pull a complementary bit line voltage $V_{BL}$ # on the complementary bit line BL # to reach a strong potential of a first logic, such as reaching one of a sensitive amplification voltage lines SAP and SAN.

The second inverting unit 132 is arranged between and connected with the complementary bit line BL # and the target bit line BL. When the complementary bit line voltage $V_{BL}$ # on the complementary bit line BL # is pulled to reach the strong potential of the first logic, the second inverting unit 132 is flipped based on the complementary bit line voltage $V_{BL}$ # to pull the target bit line voltage $V_{BL}$ on the target bit line BL to reach the strong potential of a second logic. The second logic is opposite to the first logic.

Figure 4:
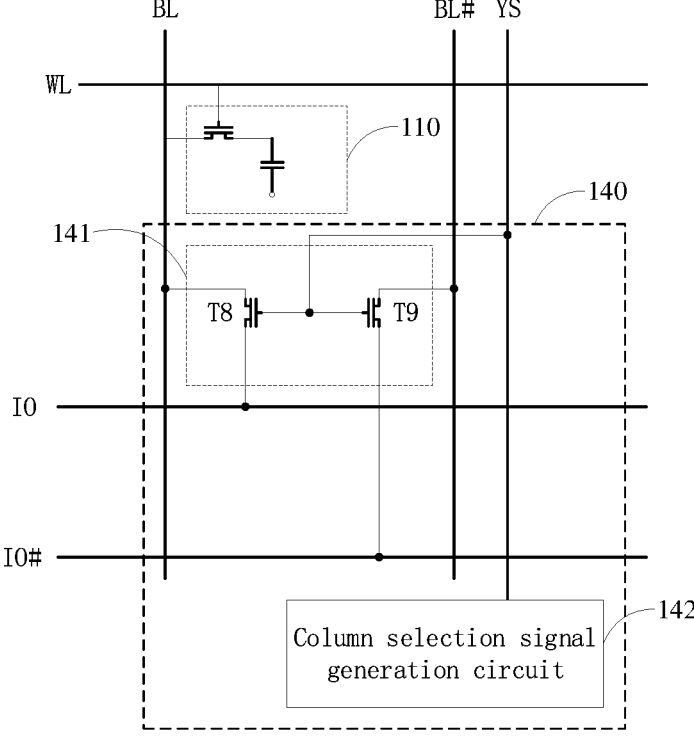
FIG. 4 is a structural schematic view a column selection circuit shown in FIG. 1.

As shown in FIG. 4, FIG. 4 is a structural schematic view a column selection circuit shown in FIG. 1. The column selection circuit 140 includes a column selection signal generation circuit 142 and a plurality of column selection modules 141. Each column selection module 141 is connected to one pair of complementary bit lines (BL/BL #) to determine whether the current pair of complementary bit lines (BL/BL #) is selected to be conducted with the connected pair of complementary input-output lines (IO/IO #) based on a corresponding column selection signal YS generated by the column selection signal generation circuit 142.

The column selection module 141 includes a switch T8 and a switch T9. A control end of the switch T8 and a control end of the switch T9 are connected to the column selection signal generation circuit 142 to receive the corresponding column selection signal YS. A first conduction end of the switch T8 is connected to the target bit line BL, and a second conduction end of the switch T8 is connected to the target input-output line IO. A first conduction end of the switch T9 is connected to the complementary bit line BL #, and a second conduction end of the switch T9 is connected to the complementary input-output line IO #.

Specifically, when the corresponding column selection signal YS generated by the column selection signal generation circuit 142 controls the switch T8 and the switch T9 to be turned on (conducted), the target bit line BL is connected to the target input-output line IO, and the complementary bit line BL # is connected to the complementary input-output line IO #, such that the pair of complementary bit lines (BL/BL #) is selected to be conducted with the pair of complementary input-output lines (IO/IO #). While the writing operation is being performed, the pair of complementary bit lines (BL/BL #) are charged and discharged via the pair of complementary input/output lines (IO/IO #). In this way, a signal on the pair of complementary input/output lines (IO/IO #) may be re-written to be the voltage on the pair of complementary lines (BL/BL #). While the reading operation is being performed, the signal on the pair of complementary bit lines (BL/BL #) is output to the pair of complementary input/output lines (IO/IO #).

In some embodiments, each of the switch T8 and the switch T9 may be the nMOS transistor, but the present disclosure does not limit the type of the transistor, the switch may alternatively be a transistor in another type.

Figure 5:
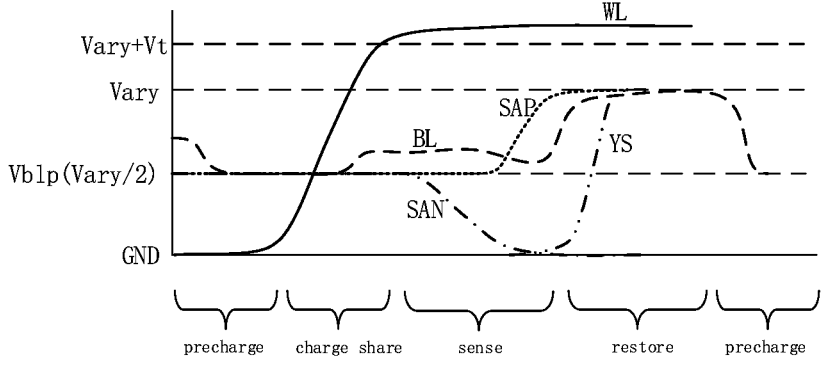
FIG. 5 is a schematic view of a potential trend of a random memory according to an embodiment of the present disclosure.

As shown in FIG. 5, referring to FIGS. 1 to 4 in the above, FIG. 5 is a schematic view of a potential trend of the random memory according to an embodiment of the present disclosure. In the following, an operation process of a dynamic random memory of the present embodiment will be described by taking the reading operation as an example. A complete Pre-charge-Activation (Pre-Act) cycle of the dynamic random memory includes a pre-charge stage, a charge share stage, a sense stage, and a restore stage. In some embodiments, one pre-act cycle of the dynamic random memory may further include an offset cancellation stage prior to the charge share stage.

The Pre-Charge Stage:

In response to the operation command being a pre-charge command PRE_CMD, the pre-charge stage is entered. At first, the switch T2, and the switch T3 are turned-on via the control signal BLEQ, the voltage on the target bit line BL and the voltage on the complementary bit line BL # are pre-charged to reach the Vblp. When Vblp=Vary/2, a next stage is entered.

The Charge Share Stage:

After the pre-charge stage, the voltage on the target bit line BL and the voltage on the complementary bit line BL # are stabilized at the Vblp. At this time point, a corresponding word line WL is selected by an activation command Active CMD and a row address RA, and the access switch in the corresponding storage unit 110 is turned-on. The positive charges stored in the storage capacitor in the storage unit 110 (for example, when the storage unit 110 stores "1", the voltage at the common end of the capacitor is Vary/2, and the voltage at the other end is Vary) may flow to the target bit line BL. Therefore, the voltage on the target bit line BL is shifted upwards to reach Vblp+. When the storage unit 110 stores "0", the voltage on the target bit line BL is shifted down to reach Vblp−. Further, a next stage is entered.

The Sense Stage:

When the storage unit 110 stores "1", following situations may occur. The voltage on the target bit line BL is shifted upwards to reach the Vblp+ in the charge share stage, and in this case, the sensitive amplification voltage line SAN is set to be the strong potential of the logic "0", and the sensitive amplification voltage line SAP is set to be the strong potential of the logic "1". The "1" stored in the storage unit 110 allows the voltage of the target bit line BL to be pulled up to reach the Vblp+, whereas the voltage on the complementary bit line BL # is still Vblp. Therefore, the voltage on the complementary bit line BL # is pulled up to reach the strong potential of the logic "0" by the SAN, and the voltage on the target bit line BL is also pulled by the SAP to reach the strong potential of the logic "1". Finally, the voltage on the target bit line BL and the voltage on the complementary bit line BL # are both at a stable state. The voltage on the target bit line BL correctly presents the information Bit ("1") stored in the storage capacitor in the storage unit 110.

When the storage unit 110 stores "0", following situations may occur. In the charge share stage, the voltage on the target bit line BL is shifted down to reach the Vblp−. Since the voltage on the complementary bit line BL # is still at the Vblp at this time point, the voltage on the complementary bit line BL # is pulled by the SAP to reach the strong potential of the logic "1", and the voltage on the target bit line BL is also pulled to reach the strong potential of the logic "0" by the SAN. Finally, the voltage on the target bit line BL and the voltage on the complementary bit line BL # are both at the stable state. The voltage on the target bit line BL correctly presents the information Bit ("0") stored in the storage capacitor in the storage unit 110.

The Restore Stage:

After the sense stage is completed, the target bit line BL is at the strong potential of the logic "1" or the logic "0" stably. At this time point, the target bit line BL charges the storage capacitor in the storage unit 110, or allows the storage capacitor to discharge. In this way, after a specific period of time, the charges of the storage capacitor may be restored to a state before the reading operation.

In addition, as shown in FIG. 4, in the sense stage, the voltage difference between the target bit line BL and the complementary bit line BL # is amplified to reach a full swing by the sense amplification module 130. Subsequently, the switch T8 and the switch T9 are controlled to enter the turned-on state, in response to the operation command being the read command RD_CMD or the write command WR_CMD and in response to the operation command and the column address CA controlling the column selection signal generation circuit 142 to control the corresponding YS signal to be set to be active. In this way, the strong "1" or the strong "0" signal on the target bit line BL is output to the IO line, and external components may read specific information. To be noted that, the aforementioned restore stage is performed automatically while the word line WL is turned-on (conducted). Therefore, for the reading operation, the restore operation may be performed after the YS signal is activated.

The above process describes a timing sequence of performing various processes of a complete reading operation. First several processes of the writing operation are the same as those of the reading operation and include a pre-charge stage, a charge share stage, a sense stage, and a restore stage. A difference between the writing operation and the reading operation is that, the restore stage of the writing operation includes a write stage and a write recovery operation performed after the write stage, which will be described in the following.

As shown in FIG. 4, the column selection signal YS is controlled by the column selection signal generation circuit 142 and allows the switch T8 and the switch T9 to enter the turned-on state, and the signal of the input and output line IO may rewrite the target bit line BL. In this case, when "0" is written, the target bit line BL is pulled to reach a voltage level of the logic "0", and the complementary bit line BL # is pulled to reach a voltage level of the logic "1". When "1" is written, the target bit line BL is pulled to reach the voltage level of the logic "1", and the complementary bit line BL # is pulled to reach the voltage level of the logic "0".

Subsequently, the write recovery is performed. After a specific period of time (i.e., after tWR), when the charges in the storage capacitor in the storage unit 110 is discharged to reach "0" or charged to reach "1" by the voltage on the target bit line BL, the switch in the storage unit 110 is controlled to be turned-off by the word line WL. In this way, the operation of writing "0" or "1" is completed.

The applicant has found, after a long-term research, that while performing the writing operation, the single kind of the pre-charge voltage Vblp of a bit line may not properly ensure the charges in the storage capacitor corresponding to the writing operation, such that the data that is read in the reading operation may be inaccurate. Therefore, the present disclosure further provides any of the following technical solutions to solve any of the above problems.

Figure 6:
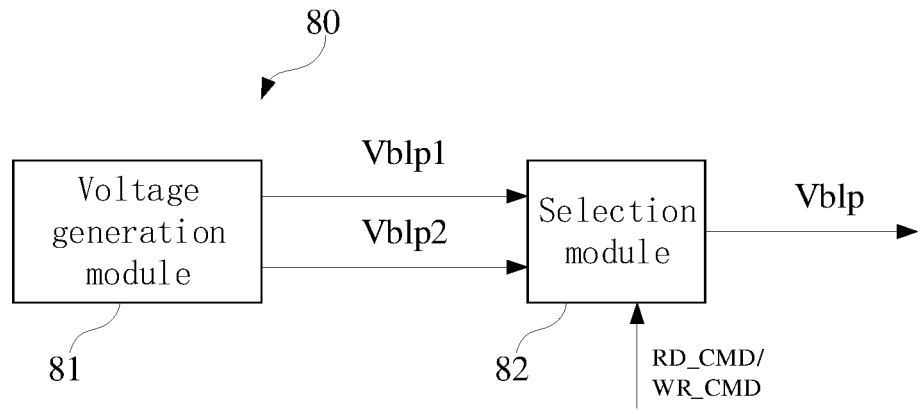
FIG. 6 is a structural schematic view of a pre-charge voltage generation circuit applicable to a random memory according to a first embodiment of the present disclosure.

FIG. 6 is a structural schematic view of a pre-charge voltage generation circuit 80 applicable to the random memory according to a first embodiment of the present disclosure. The pre-charge voltage generation circuit 80 is configured to selectively provide the pre-charge voltage Vblp. The pre-charge voltage generation circuit 80 includes: a voltage generation module 81 and a selection module 82.

The voltage generation module 81 is configured to generate a first voltage Vblp1 and a second voltage Vblp2. The first voltage Vblp1 or the second voltage Vblp2 serves as the pre-charge voltage Vblp. The first voltage Vblp1 is greater than the second voltage Vblp2. For example, the first voltage Vblp1 is 0.5V, and the second voltage Vblp2 is 0.35V, 0.4V or 0.45V, as long as the second voltage Vblp2 is less than the first voltage Vblp1.

The selection module 82 is coupled to the voltage generation module 81 to determine to output the second voltage Vblp2 as the common end voltage of at least one storage capacitor of the random memory in response to the operation command being the write command WR_CMD. In another embodiment, when the write command WR_CMD is received after the sense stage (for example, when the column selection signal YS is set to be active as shown in FIG. 5), the selection module 82 determines the second voltage Vblp2 as the voltage of the common end (such as a bottom plate) of the storage capacitor.

In some embodiments, the selection module 82 determines to output the first voltage as the common end voltage in response to the operation command being the read command. In another embodiment, when the read command RD_CMD is received after the sense stage (for example, when the column selection signal YS is set to be active as shown in FIG. 5), the selection module 82 determines the first voltage Vblp1 as the voltage of the common end (such as the bottom plate) of the storage capacitor.

In some embodiments, the selection module 82 may selectively output, in the pre-charge stage based on an actual operation command, the first voltage Vblp1 to the corresponding bit line BL, allowing the first voltage Vblp1 to serve as the pre-charge voltage Vblp of the bit line BL and the common end voltage. When the corresponding word line conducts the corresponding switch transistor, the selection module 82 may take the pre-charge voltage Vblp to share charges with the storage capacitor and perform subsequent operations after the charge sharing. In some embodiments, in the pre-charge stage, the pre-charge voltage Vblp selected by the read/write command in a previous Pre-Act cycle may be used directly.

In an application scenario, the selection module 82 outputs, in response to the operation command being the pre-charge command PRE_CMD, the first voltage Vblp1 to the bit-line pre-charge module, allowing the first voltage Vblp1 to serve as the pre-charge voltage Vblp, such that the bit-line pre-charge module outputs the pre-charge voltage Vblp to the corresponding bit line BL in the pre-charge stage. The selection module 82 outputs, in response to the operation command being the write command WR_CMD, the second voltage Vblp2 as the common end voltage of the storage capacitor of the random memory.

When the write command is writing "1", the corresponding word line conducts the corresponding switch transistor and takes an array voltage corresponding to the logic "1" data to write charges to the storage capacitor via the corresponding bit line BL. For example, the array voltage corresponding to the logic "1" data is IV, indicating that the storage capacitor has completed the operation of writing "1".

When the storage capacitor completes the operation of writing "1", the amount of charges stored in the storage capacitor is determined by a value of the array voltage corresponding to the logic "1" data subtracting the second voltage Vblp2. That is, the voltage difference between the array voltage and the second voltage may determine the amount of charges written to the storage capacitor. It is understood that the voltage difference is proportional to the amount of charges written to the storage capacitor. That is, the larger the voltage difference, the more charges are written to the storage capacitor; and the smaller the voltage difference, the less charges are written to the storage capacitor. Since the second voltage Vblp2 is lower, the value of the array voltage corresponding to the logic "1" data subtracting the second voltage Vblp2 is larger. Therefore, the amount of charges in the storage capacitor may be increased.

Furthermore, when the storage capacitor is read in a next pre-charge-activation (Pre-Act) cycle, the selection module 82 selects, in response to the pre-charge command PRE_CMD, the first voltage Vblp1 as the pre-charge voltage Vblp. The pre-charge voltage Vblp is output to the corresponding bit line BL to allow the bit line BL to perform the pre-charge operation. The pre-charge voltage Vblp (in this case, the first voltage Vblp1) also serves as the common end voltage of the storage capacitor, such that the voltage at the other end of the memory capacitor is higher than the array voltage. In this case, the switch transistor between the bit line BL and the storage capacitor is turned on (conducted), and the bit line BL is coupled to an top plate (i.e., the other end of the storage capacitor) of the storage capacitor via the switch transistor. Charge sharing is performed between the bit line BL and the storage capacitor. The voltage at the common end of the bottom plate of the storage capacitor is the first voltage Vblp1, and therefore, the voltage at the other end of the storage capacitor is higher than the array voltage based on the voltage difference during the data is being written into the storage capacitor. Therefore, after the charge sharing between the bit line BL and the storage capacitor, the bit line BL is pulled from the pre-charge voltage to reach a third voltage, and the third voltage is determined by the first voltage of the common end voltage and the voltage difference of the storage capacitor after the data is written. Since the voltage at the other end of the storage capacitor is higher than the array voltage, the voltage of bit line BL is pulled up from the pre-charge voltage to the third voltage.

More details about differences between the present disclosure and the related art are as follows. In the following, the first voltage Vblp1 is defined as 0.5 V, and the second voltage Vblp2 is defined as 0.4 V.

In the art, regardless of the read command or the write command, the first voltage Vblp1 is determined to serve as both the common end voltage of the storage capacitor and the pre-charge voltage of the bit line BL. Therefore, in the art, the first voltage Vblp1 is taken as the pre-charge voltage Vblp of the bit line BL, and the first voltage Vblp1 is output as the common end voltage of an end of the storage capacitor in response to the operation command being the write command. Since the bit line BL is coupled to the storage capacitor via the switch transistor, the bit line BL is coupled to the top plate of the storage capacitor via the switch transistor when the corresponding word line conducts the corresponding switch transistor. Charge sharing is performed between the bit line BL and the storage capacitor. For example, charges are written into the storage capacitor by using the array voltage corresponding to the logic "1" data. For example, the array voltage corresponding to the logic "1" data is 1 V, indicating that the storage capacitor has completed the operation of writing "1".

When the storage capacitor complete operation of writing "1", the voltage difference of the storage capacitor is 0.5 V.

Further, when the storage capacitor is read, the first voltage Vblp1 is output as the bit line pre-charge voltage Vblp and is output to the corresponding bit line BL to cause the bit line BL to perform the pre-charge operation. Further, the first voltage Vblp1 is output as the common end voltage of the storage capacitor(s) of the random memory. Since the bit line BL is coupled to the storage capacitor via the switch transistor, the bit line BL is coupled to the top plate of the storage capacitor via the switch transistor when the corresponding word line conducts the corresponding switch transistor. Charge sharing is performed between the bit line BL and the storage capacitor. The voltage at the common end of the bottom plate of the storage capacitor is the first voltage Vblp1, and the voltage difference of the storage capacitor is 0.5 V when data is being written. Therefore, after the charge sharing is performed between the bit line BL and the storage capacitor, the voltage of the bit line BL may be pulled up to reach a potential between 0.5V and IV, such as 0.75V or 0.7V.

In the present disclosure, the first voltage Vblp1 or the second voltage Vblp2 serves as the pre-charge voltage of the bit line BL. The selection module 82 selectively outputs the second voltage Vblp2 as the voltage at the common end of the storage capacitor in response to the operation command being the write command. The selection module 82 outputs the second voltage Vblp2, which has the lower value, as the common end voltage of an end of the storage capacitor(s) in response to the operation command being the write command.

Since the bit line BL is coupled to the storage capacitor via the switch transistor, the bit line BL is coupled to the top plate of the storage capacitor via the switch transistor when the corresponding word line conducts the corresponding switch transistor. Charge sharing is performed between the bit line BL and the storage capacitor. For example, charges are written into the storage capacitor by using the array voltage corresponding to the logic "1" data, for example, when the array voltage corresponding to the logic "1" data is 1 V, indicating that the storage capacitor has completed the operation of writing "1".

When the storage capacitor completes writing "1", the voltage difference of the storage capacitor is 0.6V.

Further, when the storage capacitor is being read, the selection module 82 selectively outputs the first voltage Vblp1 as the common end voltage of the storage capacitor of the random memory. Since the bit line BL is coupled to the storage capacitor via the switch transistor, the bit line BL is coupled to the top plate of the storage capacitor via the switch transistor when the corresponding word line conducts the corresponding switch transistor. Charge sharing is performed between the bit line BL and the storage capacitor. The voltage at the common end of the bottom plate of the storage capacitor is the first voltage Vblp1, and the voltage difference of the storage capacitor is 0.6 V when data is being written. Therefore, after charge sharing is performed between the bit line BL and the storage capacitor, and when the first voltage Vblp1 is taken as the pre-charge voltage, the voltage of the bit line BL may be pulled up to reach a potential, such as 0.8V or 0.75V, which is higher than the voltage of the bit line BL in the art.

Therefore, for the reading and writing processes in the present disclosure, when the data "1" is being written, the voltage of the common end of the storage capacitor(s) may be reduced to allow more charges to be written into the storage capacitor(s). In this way, while performing reading, more charge may be read, ensuring that the data "1" can be read. Therefore, accuracy of writing the data "1" may be improved, and accuracy of reading the data "1" may be improved.

Further, in some embodiments, an influence of temperatures on data writing may be considered. As the temperature increases, an influence on writing the charges to the storage capacitor(s) may be increased. That is, as the temperature increases, a loss of the charges in the storage capacitor(s) may be increased. Therefore, a temperature signal may be taken to allow the selection module 82 to selectively output the voltage.

In some embodiments, in the pre-charge stage, the selection module 82 determines to output the first voltage Vblp1 as the bit-line pre-charge voltage Vblp to the corresponding bit line BL to allow the bit line BL to perform the pre-charge operation. That is, the selection module 82 provides the pre-charge voltage Vblp to the bit-line pre-charge module to pre-charge the bit line to reach the pre-charge voltage Vblp in the pre-charge stage. The selection module 82 determines to output the second voltage Vblp2 as the common end voltage of the storage capacitor(s) in response to the operation command being the write command and in response to a first temperature signal temp1. When the write command is writing 1, the voltage at the other end of the storage capacitor(s) is the array voltage, and the voltage difference between the array voltage and the second voltage determines the amount of charges written to the storage capacitor(s).

In the pre-charge stage, the selection module 82 determines to output the first voltage Vblp1 as the bit-line pre-charge voltage Vblp to the corresponding bit line BL to cause the bit line BL to perform the pre-charge operation. At the same time, the first voltage Vblp1 also serves as the common end voltage of the storage capacitor(s) to allow the voltage at the other end of the storage capacitor(s) to be higher than the array voltage in the charge share stage. Further, in response to the operation command being the read command, the selection module 82 also determines to output the first voltage Vblp1 as the common end voltage of the storage capacitor(s).

In some embodiments, in the pre-charge phase, the selection module 82 determines to output the first voltage Vblp1 as the bit-line pre-charge voltage Vblp to the corresponding bit line BL to cause the bit line BL to perform the pre-charge operation. The selection module 82 determines to output the first voltage Vblp1 as the common end voltage of the storage capacitor in response to the operation command being the write command and in response to the second temperature signal temp2. A temperature corresponding to the second temperature signal temp2 is less than a temperature corresponding to the first temperature signal temp1.

In an application scenario, in the pre-charge stage, the selection module 82 determines to output the first voltage Vblp1 as the bit-line pre-charge voltage Vblp to the corresponding bit line BL to cause the bit line BL to perform the pre-charge operation. Further, the selection module 82 determines to output the second voltage Vblp2 as the common end voltage of the storage capacitor in response to the operation command being the write command as well as in response to the first temperature signal temp1.

Since the bit line BL is coupled to the storage capacitor via the switch transistor, the bit line BL is coupled to the top plate of the storage capacitor via the switch transistor when the corresponding word line conducts the corresponding switch transistor. Charge sharing is performed between the bit line BL and the storage capacitor. For example, charges are written into the storage capacitor by using the array voltage corresponding to the logic "1" data, for example, the array voltage Vary corresponding to the logic "1" data is IV, indicating that the storage capacitor has completed the operation of writing "1".

When the storage capacitor has completed the operation of writing "1", the voltage difference of the storage capacitor is a value of the array voltage Vary subtracting the second voltage Vblp2 corresponding to the logic "1" data.

Further, when the storage capacitor is being read, the selection module 82 determines to outputs the first voltage Vblp1 as the common end voltage of the storage capacitor(s). Since the bit line BL is coupled to the storage capacitor via the switch transistor, the bit line BL is coupled to the top plate of the storage capacitor via the switch transistor when the corresponding word line conducts the corresponding switch transistor. Charge sharing is performed between the bit line BL and the storage capacitor. Since the voltage at the common end of the bottom plate of the storage capacitor is the first voltage Vblp1, after the charge sharing between the bit line BL and the storage capacitor, the voltage of the bit line BL may be pulled up to reach the third voltage based on the voltage difference of the storage capacitor when the data is being written, and the third voltage is greater than the pre-charge voltage of the bit line BL. That is, the third voltage is determined by the voltage difference of the storage capacitor after the data is written as well as by the first voltage Vblp1 of the common end voltage.

In an application scenario, the selection module 82 determines to output the first voltage Vblp1 as the common end voltage of the storage capacitor(s) in response to the operation command being the write command as well as in response to the second temperature signal temp2.

Since the bit line BL is coupled to the storage capacitor via the switch transistor, the bit line BL is coupled to the top plate of the storage capacitor via the switch transistor when the corresponding word line conducts the corresponding switch transistor. Charge sharing is performed between the bit line BL and the storage capacitor.

When the write command is writing "1", charges are written to the storage capacitor by using the array voltage corresponding to the logic "1" data. For example, the array voltage corresponding to the logic "1" data is 1 V, indicating that the storage capacitor has completed the operation of writing "1".

When the storage capacitor has completed the operation of writing "1", the voltage difference of the storage capacitor is the value of the array voltage corresponding to the logic "1" data subtracting the first voltage Vblp1.

Further, when the storage capacitor is being read, the selection module 82 determines to output the first voltage Vblp1 as the common end voltage of the storage capacitor(s). Since the bit line BL is coupled to the storage capacitor via the switch transistor, the bit line BL is coupled to the top plate of the storage capacitor via the switch transistor when the corresponding word line conducts the corresponding switch transistor. Charge sharing is performed between the bit line BL and the storage capacitor. Since the value of the voltage at the common end of the bottom plate of the storage capacitor is the value of the first voltage Vblp1, after the charge sharing between the bit line BL and the storage capacitor, the voltage of the bit line BL may be pulled up to the fourth voltage based on the voltage difference of the storage capacitor when the data is being written. The fourth voltage is greater than the first voltage Vblp1.

When the write command is an operation of writing "0", charges are written to the storage capacitor by using the array voltage corresponding to the logic "0" data. For example, the array voltage corresponding to the logic "0" data is 0V. In this way, the storage capacitor has completed the operation of writing "0".

When the storage capacitor has completed the operation of writing "0", the voltage difference of the storage capacitor is a value of the array voltage corresponding to the logic "0" data subtracting the first voltage Vblp1.

Further, when the storage capacitor is being read, the selection module 82 determines to output the first voltage Vblp1 as the common end voltage of the storage capacitor. Since the bit line BL is coupled to the storage capacitor via the switch transistor, the bit line BL is coupled to the top plate of the storage capacitor via the switch transistor when the corresponding word line conducts the corresponding switch transistor. Charge sharing is performed between the bit line BL and the storage capacitor. Since the voltage at the common end of the bottom plate of the storage capacitor is the first voltage Vblp1, after the charge sharing between the bit line BL and the storage capacitor, the voltage of the bit line BL may be pulled down to a fifth voltage based on the voltage difference of the storage capacitor when the data is being written. The fifth voltage is lower than the first voltage Vblp1.

That is, in the above process, when performing the operation of writing "1" and when the first temperature signal temp1 is received, the selection module 82 determines to output the second voltage Vblp2 as the common end voltage of the storage capacitor. In this way, in the pre-charge stage, the selection module 82 output the first voltage Vblp1 as the bit-line pre-charge voltage Vblp to the corresponding bit line BL.

The selection module 82 determines to output the first voltage Vblp1 as the common end voltage of the storage capacitor, when the operation of writing "1" is being performed and the second temperature signal temp2 is received, or when the operation of writing "0" is being performed and the first temperature signal temp1 is received, or when the operation of writing "0" is being performed and the second temperature signal temp2 is received, or when the reading operation is being performed and the first temperature signal temp1 is received, or when the reading operation is being performed and the second temperature signal temp2 is received. Further, in the pre-charge stage, the selection module 82 outputs the first voltage Vblp1 as the bit-line pre-charge voltage Vblp to the corresponding bit line BL.

Figure 7:
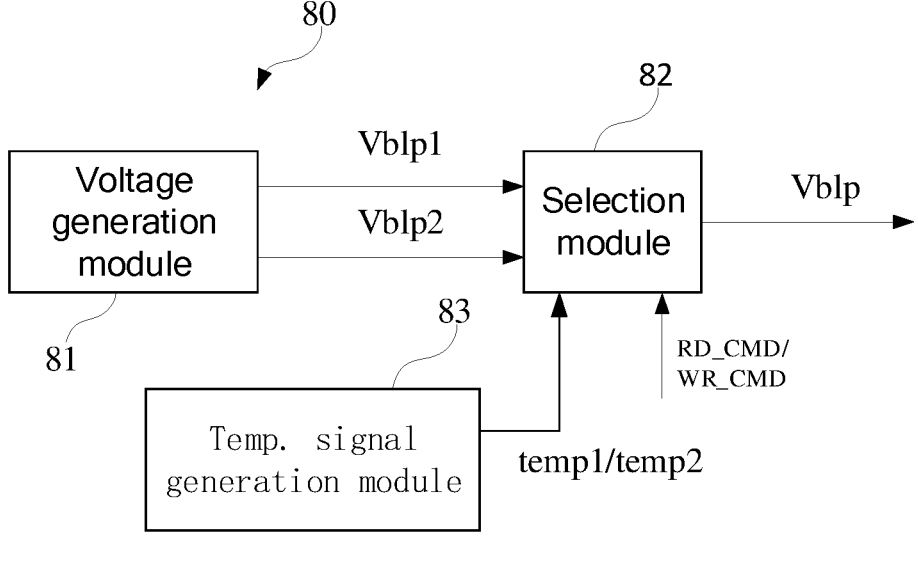
FIG. 7 is a structural schematic view of a pre-charge voltage generation circuit applicable to a random memory according to a second embodiment of the present disclosure.

FIG. 7 is a structural schematic view of a pre-charge voltage generation circuit 80 applicable to a random memory according to a second embodiment of the present disclosure. The pre-charge voltage generation circuit 80 is configured to provide the bit-line pre-charge voltage Vblp to the bit line BL in the pre-charge stage. The pre-charge voltage generation circuit 80 includes: a voltage generation module 81, a selection module 82, and a temperature signal generation module 83. The temperature signal generation module 83 is coupled to the selection module 82, generates the first temperature signal temp1 or the second temperature signal temp2 based on a temperature of the random memory, and outputs the first temperature signal temp1 or the second temperature signal temp2 to the selection module 82.

The temperature signal generation module 83 may generate a corresponding temperature signal based on temperature data collected by a temperature sensor from the random memory. For example, the temperature signal generation module 83 may set various temperature levels. When the temperature data is received, then the grade corresponding to the temperature data can be determined, the temperature signal generation module 83 may determine a temperature level corresponding to the received temperature data and output a corresponding temperature signal based on the determined level. For example, the temperature levels include a high temperature, a normal temperature, and a low temperature. Temperatures above 85 degrees Celsius may be defined as the high temperature, temperatures below 85 degrees Celsius and above 25 degrees Celsius may be defined as the normal temperature, and temperatures below 25 degrees Celsius may be defined as the low temperature. In some embodiments, rules of determining each temperature level may be determined based on a property of the random memory. For example, temperatures above 80 degrees Celsius may be defined as the high temperature, temperatures below 80 degrees Celsius and above 25 degrees Celsius may be defined as the normal temperature, and temperatures below 25 degrees Celsius may be defined as the low temperature. In another example, temperatures above 75 degrees Celsius may be defined as the high temperature, temperatures below 75 degrees Celsius and above 25 degrees Celsius may be defined as the normal temperature, and temperatures below 25 degrees Celsius may be defined as the low temperature.

In some embodiments, the temperature signal generation module 83 outputs the first temperature signal temp1 in response to high temperature writing and outputs the second temperature signal temp2 in response to high temperature reading, normal temperature writing, normal temperature reading, low temperature writing, or low temperature reading.

In some embodiments, the temperature signal generation module 83 may be coupled to the selection module 82 via various pins, controls one of the various pins to output the first temperature signal temp1, and controls another of the various pins to output the second temperature signal temp2. That is, one pin sends one temperature signal.

In some embodiments, the temperature signal generation module 83 may output the first temperature signal temp1 or the second temperature signal temp2 to the selection module 82 via one pin. For example, a logic high level is taken to indicate the first temperature signal temp1, and a logic low level is taken to indicate the second temperature signal temp2. In this way, the first temperature signal temp1 or the second temperature signal temp2 may be output to the selector module 82 by sending the logic high level or the logic low level through one pin.

Figure 8:
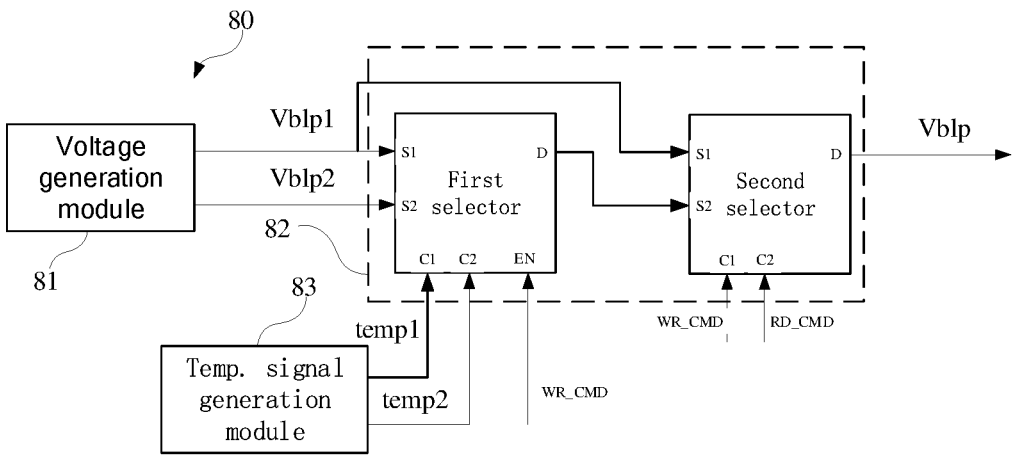
FIG. 8 is a structural schematic view of a pre-charge voltage generation circuit applicable to a random memory according to a third embodiment of the present disclosure.

FIG. 8 is a structural schematic view of the pre-charge voltage generation circuit 80 applicable to a random memory according to a third embodiment of the present disclosure. The pre-charge voltage generation circuit 80 is configured to provide the common end voltage to the storage capacitor and provide a bit-line pre-charge voltage Vblp to the bit line BL in the pre-charge stage. The pre-charge voltage generation circuit 80 includes: a voltage generation module 81 and a selection module 82.

The selection module 82 includes: a first selector and a second selector.

A first input end S1 of the first selector is coupled to the voltage generation module 81 to receive the first voltage Vblp1. A second input end S2 of the first selector is coupled to the voltage generation module 81 to receive the second voltage Vblp2. A control end of the first selector is coupled to the temperature signal generation module 83 to receive the first temperature signal temp1 or the second temperature signal temp2. The first selector further includes a third input end C1, a fourth input end C2, and an enable signal input end EN.

A first input end S1 of the second selector is coupled to the voltage generation module 81 to receive the first voltage Vblp1. A second input end S2 of the second selector is coupled to an output end D of the first selector. A control end of the second selector is configured to receive the operation command. The second selector further includes a third input end C1 and a fourth input end C2. The third input end C1 of the second selector is configured to receive the write command WR_CMD, and the fourth input end C2 of the second selector is configured to receive the read command RD_CMD.

In some embodiments, the first selector selects and outputs the second voltage Vblp2 to the second input end S2 of the second selector in response to the first temperature signal temp1. The second selector selects and outputs the second voltage Vblp2 as the voltage at the common end of the storage capacitor in response to the write command. When the write command is writing 1, the voltage at the other end of the storage capacitor is the array voltage, and the voltage difference between the array voltage and the second voltage Vblp2 determines the amount of charges written to the storage capacitor. That is, when writing the charges is completed, the voltage difference between the top plate and the bottom plate of the storage capacitor is the array voltage subtracting the second voltage Vblp2.

In some embodiments, the first selector selects and outputs the first voltage Vblp1 to the second input end S2 of the second selector in response to the fourth input end C2 of the first selector receiving the second temperature signal temp2. The second selector outputs the first voltage Vblp1 as the common end voltage of the storage capacitor in response to the write command WR_CMD.

In some embodiments, the second selector selects and outputs the first voltage Vblp1 as the voltage at the common end of the storage capacitor in response to the read command RD_CMD.

In some embodiments, the first selector selects and outputs the second voltage Vblp2 to the second input end S2 of the second selector in response to the third input end C1 of the first selector receiving the first temperature signal temp1. The second selector selects and outputs the second voltage Vblp2 as the voltage at the common end of the storage capacitor in response to the write command WR_CMD. When the write command is writing 1, the voltage at the other end of the storage capacitor is the array voltage, and the voltage difference between the array voltage and the second voltage Vblp2 determines the amount of charges written to the storage capacitor.

Further, when the operation command is the read command RD_CMD, the second selector selects and outputs, in response to the read command RD_CMD, the first voltage Vblp1 as the common end voltage of the storage capacitor and allows the bit line to share charges with the storage capacitor in the charge sharing stage. The bit line is pulled from the first voltage Vblp1 to the third voltage. The third voltage is determined by the first voltage Vblp1 of the common end voltage and by the voltage difference of the storage capacitor after the data is written.

In some embodiments, the second selector selects and outputs the first voltage Vblp1 as the pre-charge voltage and the common end voltage of the storage capacitor in response to receiving the pre-charge command PRE_CMD.

Some embodiments will be described by referring to FIG. 9.

The voltage generation module 81 is configured to generate the first voltage Vblp1 and the second voltage Vblp2. The first voltage Vblp1 or the second voltage Vblp2 is configured to serve as the pre-charge voltage Vblp. The first voltage Vblp1 is greater than the second voltage Vblp2.

The first input end S1 of the first selector is coupled to the voltage generation module 81 to receive the first voltage Vblp1. The second input end S2 of the first selector is coupled to the voltage generation module 81 to receive the second voltage Vblp2. The control end of the first selector is coupled to the temperature signal generation module 83 to receive the first temperature signal temp1 and the second temperature signal temp2. The first selector further includes the third input end C1, the fourth input end C2, and the enable signal input end EN.

The first input end S1 of the second selector is coupled to the voltage generation module 81 to receive the first voltage Vblp1. The second input end S2 of the second selector is coupled to an output end D of the first selector. The control end of the second selector is configured to receive the operation command. The second selector further includes the third input end C1 and the fourth input end C2. The third input end C1 of the second selector is configured to receive the write command WR_CMD, and the fourth input end C2 of the second selector is configured to receive the read command RD_CMD.

In an application scenario, the first selector selects and outputs the second voltage Vblp2 to the second input end S2 of the second selector in response to the first temperature signal temp1. The second selector selects and outputs the second voltage Vblp2 as the voltage at the common end of the storage capacitor in response to the write command. When the write command is writing 1, the voltage at the other end of the storage capacitor is the array voltage, and the voltage difference between the array voltage and the second voltage Vblp2 determines the amount of charges written to the storage capacitor. That is, when writing the charges is completed, the voltage difference between the top plate and the bottom plate of the storage capacitor is the array voltage subtracting the second voltage Vblp2.

In another application scenario, the first selector selects and outputs the first voltage Vblp1 to the second input end S2 of the second selector in response to the fourth input end C2 of the first selector receiving the second temperature signal temp2. The second selector outputs the first voltage Vblp1 as the common end voltage of the storage capacitor in response to the write command WR_CMD.

In another application scenario, the second selector selects and outputs the first voltage Vblp1 as the voltage at the common end of the storage capacitor in response to the read command RD_CMD.

In another application scenario, the first selector selects and outputs the second voltage Vblp2 to the second input end S2 of the second selector in response to the third input end C1 of the first selector receiving the first temperature signal temp1. The second selector selects and outputs the second voltage Vblp2 as the voltage at the common end of the storage capacitor in response to the write command WR_CMD. When the write command is writing 1, the voltage at the other end of the storage capacitor is the array voltage, and the voltage difference between the array voltage and the second voltage Vblp2 determines the amount of charges written to the storage capacitor.

Further, when the operation command is the read command RD_CMD, the second selector, in response to the read command RD_CMD, selects and outputs the first voltage Vblp1 as the common end voltage of the storage capacitor and provides the first voltage Vblp1 to the bit-line pre-charge module in response to the pre-charge command PRE_CMD in the pre-charge stage. The second selector may charge the bit line to reach the pre-charge voltage and allows the bit line to share charges with the storage capacitor in the charge sharing stage. The bit line is pulled from the first voltage Vblp1 to the third voltage. The third voltage is determined by the first voltage Vblp1 of the common end and by the voltage difference of the storage capacitor after the data is written.

In another application scenario, when the write command WR_CMD is received after the sense stage, the selector module selects the second voltage Vblp2 as the common end voltage of the storage capacitor. Specifically, the second selector selects and outputs the second voltage Vblp2 as the common end voltage of the storage capacitor in response to the write command WR_CMD.

In the sense stage of performing the read/write command, the voltage difference between the target bit line BL and the complementary bit line BL # is amplified to reach the full swing by the sense amplifier module 130. Subsequently, the column selection signal generation circuit 142 is controlled by the read/write command RD_CMD/WR_CMD and the column address CA to generate the corresponding YS signal to allow the corresponding switch to enter the turned-on state, allowing the strong "1" signal or the strong "0" signal on the target bit line BL to be output to the IO line (LIO/LIO #). Alternatively, the strong "1" signal or the strong "0" signal is written to the storage capacitor via the IO line (LIO/LIO #) and the target bit line BL. Specifically, the voltage Vblp described in the present disclosure works mainly while the read/write operation is being performed (the stage after the sense stage that receives the read/write command) and does not work in the pre-charge stage. Charges may be read or written in the sense stage, and therefore, for the write command, the second voltage Vblp2, which has a relatively small value, is taken as the common end voltage of the storage capacitor allowing more charges to be written into the storage capacitor. Therefore, more charges can be read in subsequent reading operations, the accuracy of the data may be improved. Furthermore, the influence of temperatures on the charges written to the storage capacitor when writing data may be reduced.

Figure 9:
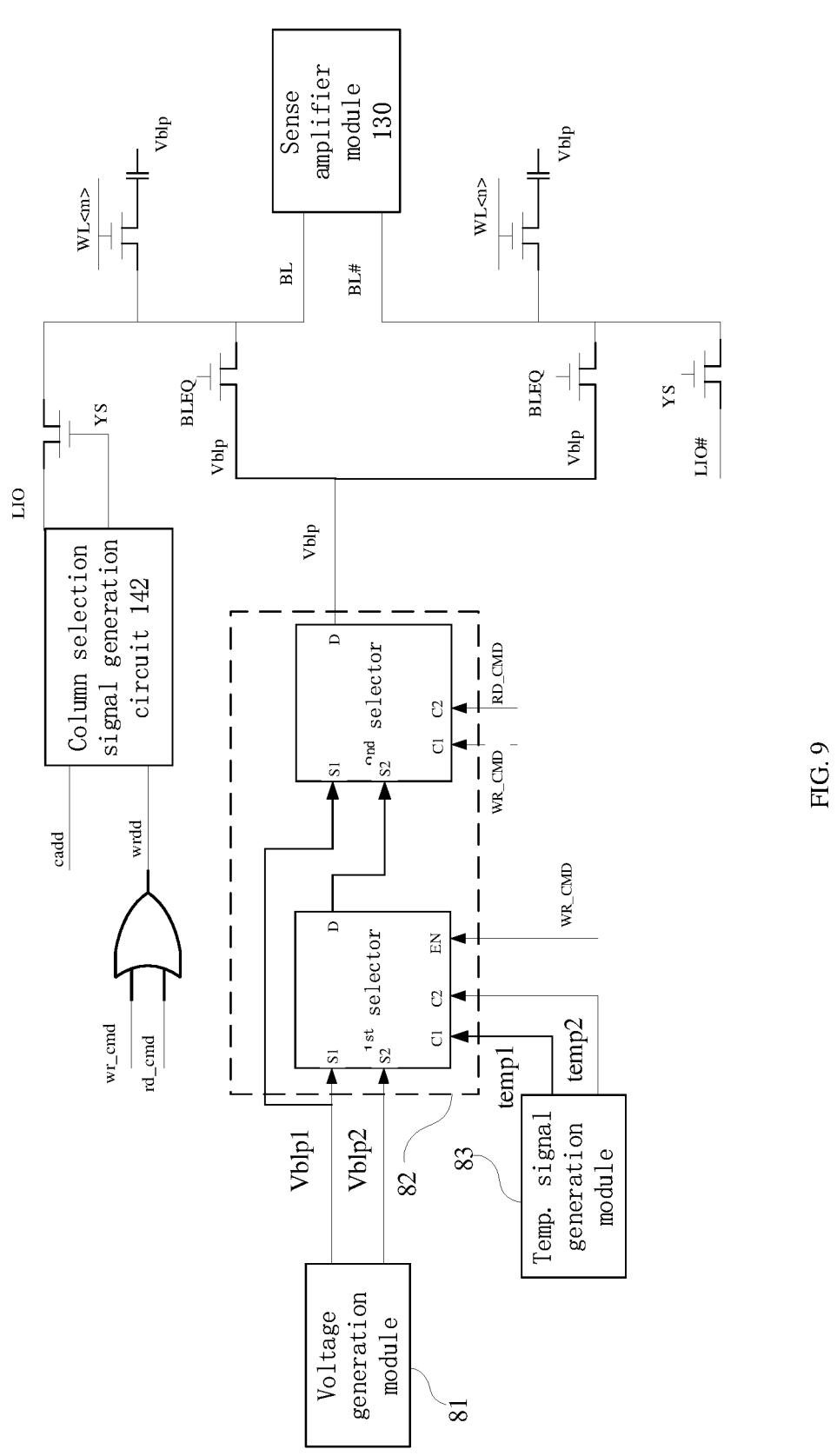
FIG. 9 is a structural schematic view of a pre-charge voltage generation circuit applicable to a random memory according to a fourth embodiment of the present disclosure.
Figure 10:
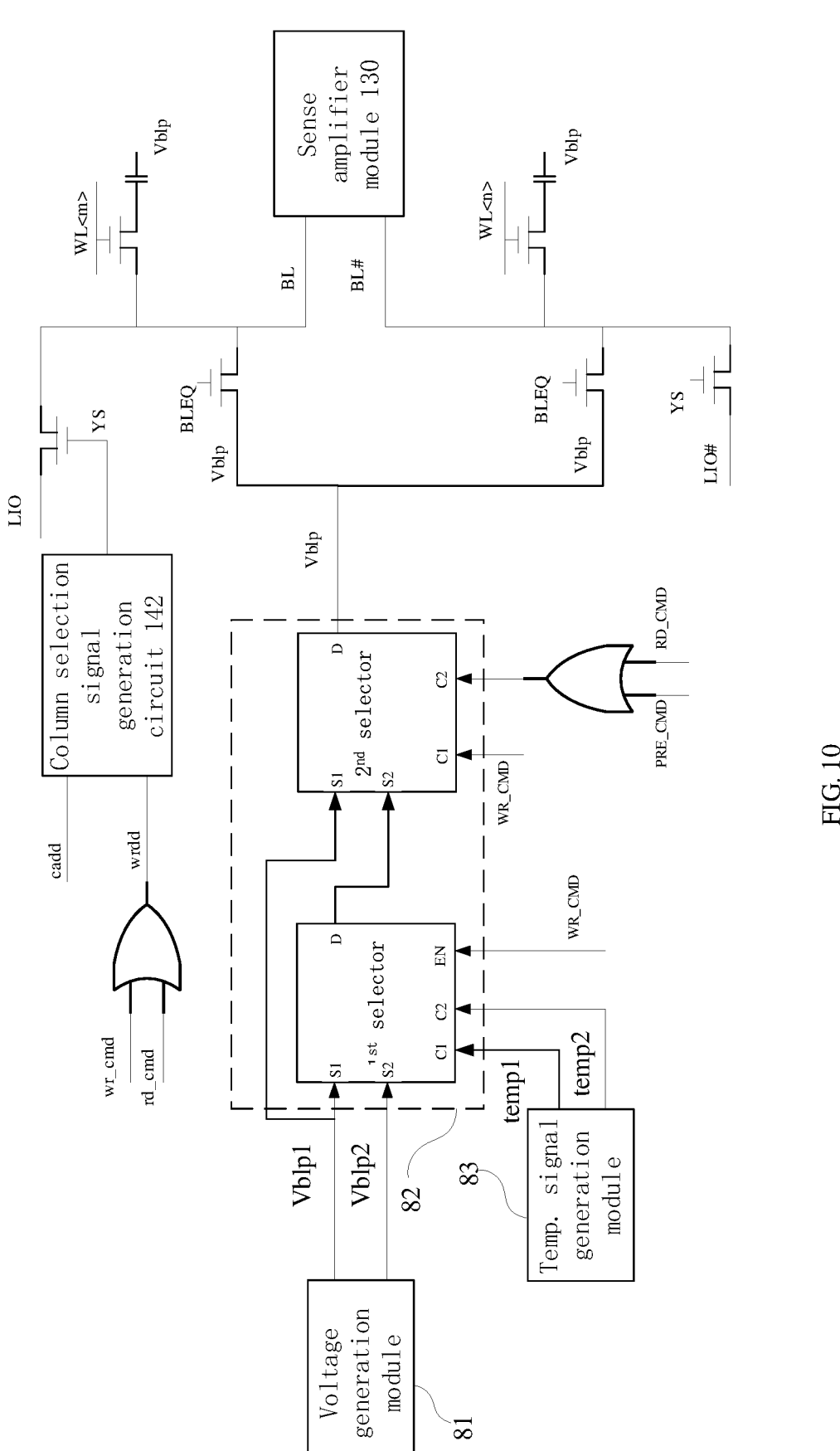
FIG. 10 is a structural schematic view of a pre-charge voltage generation circuit applicable to a random memory according to a fifth embodiment of the present disclosure.

In some embodiments, as shown in FIG. 10, being different from FIG. 9, the fourth input end C2 of the second selector is configured to receive the read command RD_CMD or the pre-charge command PRE_CMD. The fourth input end C2 is coupled via an OR gate. An input end of the OR gate is configured to receive the read command RD_CMD and the pre-charge command PRE_CMD.

In some application scenarios, the dynamic random memory reads and writes data in the same pre-charge-activation (Pre-Act) cycle. In some other application scenarios, the dynamic random memory reads data in one pre-charge-activation (Pre-Act) cycle, and writes data in another pre-charge-activation (Pre-Act) cycle. In the following, the latter application scenarios will be illustrated in FIG. 10.

In a pre-charge stage of a first Pre-Act cycle, the pre-charge stage is entered in response to the pre-charge command PRE_CMD. In this phase, a corresponding switch transistor is turned-on by the control signal BLEQ, the voltage on the target bit line BL and the voltage on the complementary bit line BL # are charged to reach the Vblp. Further, the charge share stage and the sense stage are entered.

After the sense stage, when the second selector receives the write command WR_CMD, the second selector takes the second voltage Vblp2 as the voltage of the common end of the storage capacitor. The column selection signal generation circuit 142 controls the column selection signal YS to control the corresponding switch to enter the turned-on state, and the signal of the input and output line IO rewrites the target bit line BL. In this case, when the "0" is written, the target bit line BL may be pulled to reach the logic level of "0", and the complementary bit line BL # may be pulled to reach the logic level of "1". When the "1" is written, the target bit line BL may be pulled to reach the logic level of "1", and the complementary bit line BL # may be pulled to reach the logic level of "0".

Subsequently, the write recovery is performed. After a specific period of time (i.e., tWR), when the charges in the storage capacitor in storage unit 110 is discharged to reach "0" or charged to reach "1" by the voltage on the target bit line BL, the switch in storage unit 110 may be controlled to be turned-off by the word line WL. In this way, the operation of writing "0" or "1" is completed.

When the storage capacitor is then read in a second pre-Act cycle, the second selector selects the first voltage Vblp1 as the pre-charge voltage Vblp in response to the pre-charge command PRE_CMD. The pre-charge voltage Vblp is output to the corresponding bit line BL to allow the bit line BL to perform the pre-charge operation. The pre-charge voltage Vblp (in this case the first voltage Vblp1) also serves as the common end voltage of the storage capacitor, such that the voltage at the other end of the storage capacitor is higher than the array voltage Vary.

The corresponding word line WL is selected by the activation command Active CMD and the row address RA, and the access switch in the corresponding storage unit 110 may be turned-on. The positive charges stored in the storage capacitor in the storage unit 110 (for example, when the storage capacitor stores "1", the voltage at the common end of the storage capacitor is Vary/2, and the voltage at the other end of the storage capacitor is Vary) flow to the target bit line BL, such that the voltage of the target bit line is shifted upwards to reach Vblp+. When the storage capacitor stores "0", the voltage of the target bit line BL is shifted down to reach Vblp−. Further, the sense stage is entered. The voltage difference on the target bit line BL and the complementary bit line BL # is amplified to the full swing by the sense amplifier module 130, and subsequently, the column selection signal generation circuit 142 is controlled by the read/write command RD_CMD/WR_CMD and the column address CA to generate the corresponding YS signal to control the corresponding switch to enter the turned-on state, and the strong "1" or the strong "0" on the target bit line BL is output to the IO line (LIO/LIO #). In this way, data reading is completed.

Further, as shown in FIG. 10, the first selector selects and outputs the second voltage Vblp2 to the second input end S2 of the second selector in response to the first temperature signal temp1. The second selector selects and outputs the second voltage Vblp2 as the common end voltage of the storage capacitor in response to the write command WR_CMD. The first selector selects and outputs the first voltage Vblp1 to the second input end S2 of the second selector in response to the fourth input end C2 of the first selector receiving the second temperature signal temp2. The second selector outputs the first voltage Vblp1 as the common end voltage of the storage capacitor in response to the write command WR_CMD.

Figure 11:
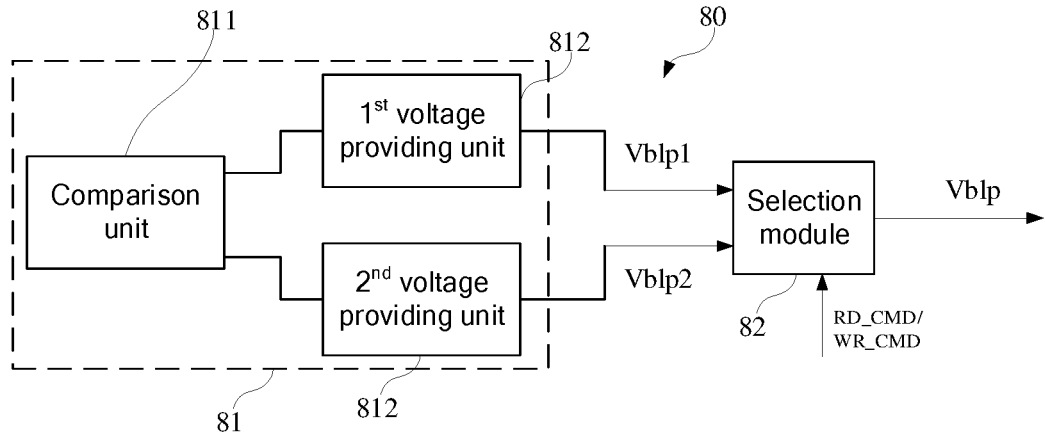
FIG. 11 is a structural schematic view of a pre-charge voltage generation circuit applicable to a random memory according to a sixth embodiment of the present disclosure.

FIG. 11 is a structural schematic view of a pre-charge voltage generation circuit 80 applicable to a random memory according to a sixth embodiment of the present disclosure. The pre-charge voltage generation circuit 80 is configured to provide the bit-line pre-charge voltage Vblp to the bit line BL in the pre-charge stage. The pre-charge voltage generation circuit 80 includes: a voltage generation module 81 and a selection module 82. The selection module 82 is the same as the selection module 82 in any of the above embodiments and will not be repeated herein.

The voltage generation module 81 includes: a comparison unit 811, a first voltage providing unit 812, and a second voltage providing unit 813.

The comparison unit 811 is configured to provide a baseline voltage Vary.

The first voltage providing unit 812 is coupled to an output end D of the comparison unit and is configured to output the first voltage Vblp1 based on the baseline voltage.

The second voltage providing unit 813 is coupled to the output D end of the comparison unit and is configured to output the second voltage Vblp2 based on the baseline voltage.

Figure 12:
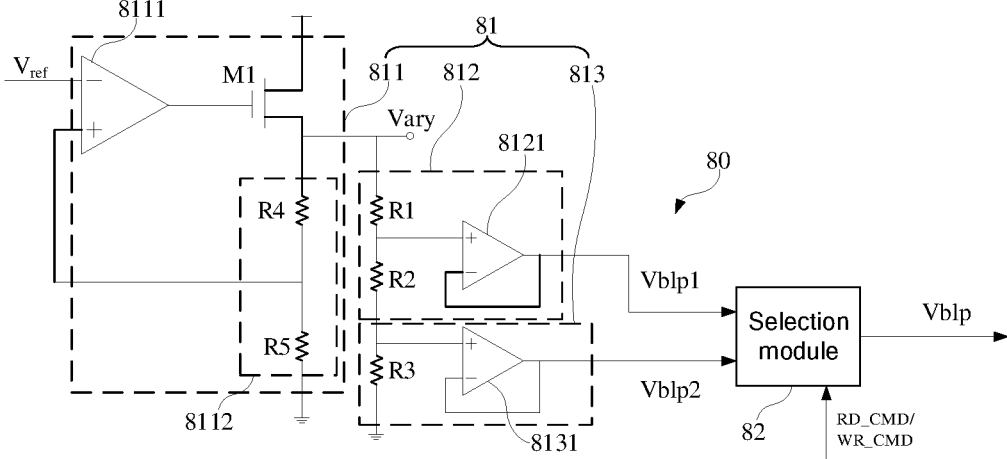
FIG. 12 is a structural schematic view of a pre-charge voltage generation circuit applicable to a random memory according to a seventh embodiment of the present disclosure.
Figure 13:
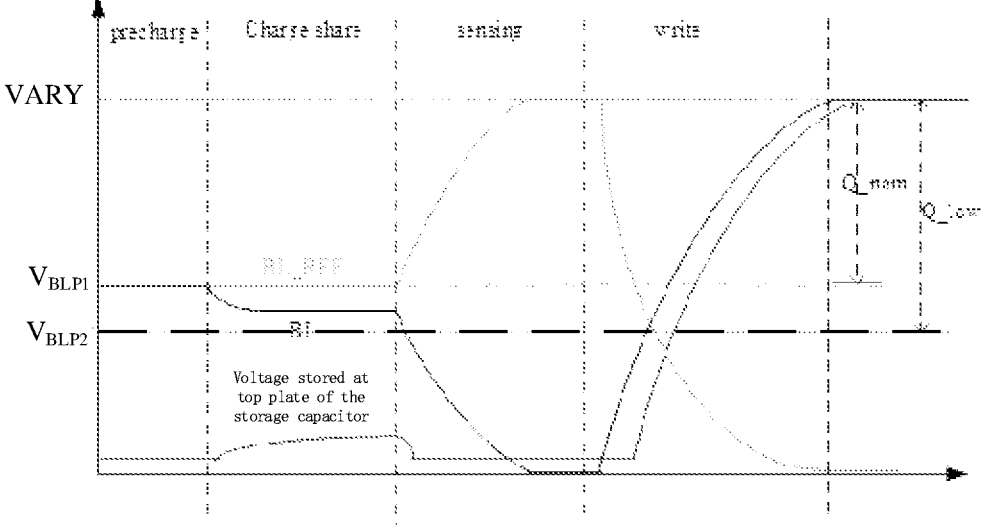
FIG. 13 is a flow chart of a writing operation of a pre-charge voltage generation circuit applicable to a random memory according to an embodiment of the present disclosure.

Further, as shown in FIG. 12, the comparison unit 811 includes: a first amplifier 8111, a switch unit M1, and an adjustment unit 8112. The first voltage providing unit 812 includes: a first resistor R1, a second resistor R2, and a second amplifier 8121. The second voltage providing unit 813 includes: a third resistor R3 and a third amplifier 8131.

A negative phase input end of the first amplifier 8111 receives a reference voltage Vref. A control end of the switch unit M1 is coupled to an output end of the first amplifier 8111. A first end of the switch unit M1 receives an operating voltage. A second end of the switch unit M1 outputs the baseline voltage Vary. A first end of the adjustment unit 8112 is coupled to the second end of the switch unit M1. A second end of the adjustment unit 8112 is coupled to the in-phase input end of the first amplifier 8111. The switch unit M1 may be a MOS transistor or a triode.

A first end of the first resistor R1 is coupled to the first end of the adjustment unit 8112. A first end of the second resistor R2 is coupled to a second end of the first resistor R1. An in-phase input end of the second amplifier 8121 is coupled to a coupling point between the first resistor R1 and the second resistor R2. An output end of the second amplifier 8121 is coupled to the negative phase input end of the second amplifier 8121, and an output end of the second amplifier 8121 outputs the first voltage Vblp1.

A first end of the third resistor R3 is coupled to the second end of the second resistor R2. An in-phase input end of the third amplifier 8131 is coupled to a coupling point between the second resistor R2 and the third resistor R3. An output end of the third amplifier 8131 is coupled to the negative phase input end of the third amplifier 8131. The output end of the third amplifier 8131 outputs the second voltage Vblp2.

A sum of a resistance value of the third resistor R3 and a resistance value of the second resistor R2 is equal to a resistance value of the first resistor R1. In this way, voltage may be divided to the third resistor R3 and the second resistor R2, and the first voltage Vblp1 may be determined based on the resistance value of the third resistor R3 and the resistance value of the second resistor R2.

Further, a voltage at the coupling point between the first end of the first resistor R1 and the first end of the adjustment unit 8112, i.e., the Vary in FIG. 12, may serve as a driving voltage for writing data and for reading commands.

The first voltage is a half of the array voltage VARY.

Further, the adjustment unit 8112 includes: a fourth resistor R4 and a fifth resistor R5. A first end of the fourth resistor R4 is coupled to the second end of the switch unit M1. A first end of the fifth resistor R5 is coupled to a second end of the fourth resistor R4. A second end of the fifth resistor R5 is grounded. A coupling point between the fourth resistor R4 and the fifth resistor R5 is coupled to the in-phase input end of the first amplifier 8111.

Further, the entire data reading and writing process of the present disclosure is illustrated by referring to FIG. 12.

In the present disclosure, reducing the bit-line pre-charge voltage Vblp during the writing operation means selecting the second voltage Vblp2, which has a relatively low value (including the voltage of the bottom plate of the storage capacitor and the pre-charge voltage of the bit line BL in the pre-charge stage), while performing the writing operation. In fact, only the voltage of the bottom plate of the storage capacitor needs to be changed while performing the writing operation. In the entire writing operation, the control unit corresponding to the bit line BL may not be enabled, and the pre-charge voltage in the pre-charge stage may not affect the voltage of the bit line BL.

The greater the voltage difference between the top plate and the bottom plate of the storage capacitor, the more charges may be stored in the storage capacitor, and that is, the better the storage capacitor is able to store the data "1". In FIG. 12, the storage capacitor stores "0" at an initial state. The voltage of the bit line BL is changed by performing the writing operation, and the amount of charges in the storage capacitor is changed accordingly. When the first voltage Vblp1 is used while performing the writing operation, the amount of charges in the storage capacitor is Q_nom. However, when the second voltage Vblp2 is used while performing the writing operation, the amount of charges in the storage capacitor is Q_low. Apparently, Q_low>Q_nom, and the data "1" may be stored better when the second voltage Vblp2 is being used under the writing operation.

Figure 14:
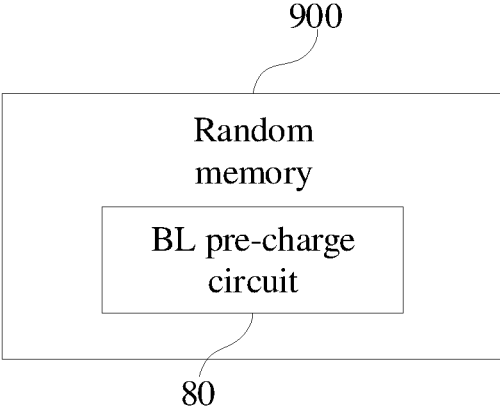
FIG. 14 is a structural schematic view of a random memory according to an embodiment of the present disclosure.

FIG. 14 is a structural schematic view of a random memory according to an embodiment of the present disclosure.

The random memory 900 includes the pre-charge voltage generation circuit 80 as described in any of the above embodiments. In some embodiments, the random memory 900 in the present disclosure is a dynamic random access memory (DRAM). The DRAM is a semiconductor memory. For DRAM, the amount of charges stored in a capacitor may represent a binary bit (bit) of "1" or "0".

By performing the above technical solutions, different voltages are used, in response to the read command and for the write command, as the common end voltage of the storage capacitor. In this way, for the write command, the second voltage Vblp2, which has a relatively low value, is used as the common end voltage of the storage capacitor, such that more charges may be written to the storage capacitor, and more charges may be read in subsequent reading operations. Therefore, accuracy of the data may be improved. Furthermore, the influence of temperature on the charges written to the storage capacitor when writing the data may be reduced.

Embodiments of the present disclosure may be stored in a computer readable storage medium when implemented in the form of a software functional unit and sold or used as a stand-alone product. It is understood that the technical solution of the present disclosure or part or all of the technical solution, which essentially contributes to the art, may be embodied in the form of a software product, and the software product may be stored in a storage medium and includes a number of instructions to enable a computer device (which may be a personal computer, a server, a network device, and so on) or a processor to perform all or some of the operations of the method described in the various embodiments of the present disclosure. The aforementioned storage media include a USB disk, a mobile hard drive, a read-only memory, a random access memory, a magnetic disk or an optical disk, and any other medium that can store program codes.

The above description is only embodiments of the present disclosure and is not intended to limit the scope of the present disclosure. Any equivalent structure or equivalent process transformation based on the specification and the accompanying drawings of the present disclosure, applied directly or indirectly in other related fields, shall be equally covered by the present disclosure.

What is claimed is:

1. A pre-charge voltage generation circuit configured for a random memory, wherein the pre-charge voltage generation circuit is configured to selectively provide a pre-charge voltage and comprises:

a voltage generation module, configured to generate a first voltage and a second voltage, wherein the first voltage or the second voltage is configured to serve as a pre-charge voltage, and the first voltage is greater than the second voltage; and a selection module, coupled to the voltage generation module, wherein the selection module is configured to select and output, in response to an operation command being a write command, the second voltage as a voltage of a first end of at least one storage capacitor of the random memory, and is configured to select and output, in response to the operation command being a read command, the first voltage as the voltage of the first end, the selection module is configured to select and output, in response to the operation command being the write command and in response to a first temperature signal, the second voltage as the voltage of the first end of the at least one storage capacitor; and for each of the at least one storage capacitor, a voltage at the other end of the storage capacitor is an array voltage when the write command is writing 1, and the amount of charges written to the storage capacitor is determined based on a voltage difference between the array voltage and the second voltage, wherein the selection module is configured to select and output, in response to the operation command being the write command and in response to a second temperature signal, the first voltage as the voltage of the first end of the at least one storage capacitor, wherein a temperature corresponding to the second temperature signal is less than a temperature corresponding to the first temperature signal.

2. The pre-charge voltage generation circuit according to claim 1, wherein the pre-charge voltage generation circuitry is further configured to provide the pre-charge voltage to a bit-line pre-charge module to pre-charge a bit line to the pre-charge voltage in a pre-charge stage.

3. The pre-charge voltage generation circuit according to claim 2, wherein the selection module is configured to select and output, in response to the operation command being a pre-charge command, the first voltage as the pre-charge voltage of the pre-charge stage.

4. The pre-charge voltage generation circuit according to claim 1, wherein the selection module is configured to select the second voltage as the voltage of the first end of the at least one storage capacitor when the write command is received after a sense stage.

5. The pre-charge voltage generation circuit according to claim 1, wherein the selection module is configured to select and output, in response to the operation command being the read command, the first voltage as the voltage of the first end of the at least one storage capacitor, and the voltage at the other end of the at least one storage capacitor is greater than the array voltage.

6. The pre-charge voltage generation circuit according to claim 1, further comprising: a temperature signal generation module, coupled to the selection module and configured to generate and output the first temperature signal or the second temperature signal to the selection module based on a temperature of the random memory.

7. The pre-charge voltage generation circuit according to claim 1, wherein the selection module comprises:

a first selector, wherein a first input end of the first selector is coupled to the voltage generation module and is configured to receive the first voltage, a second input end of the first selector is coupled to the voltage generation module and is configured to receive the second voltage, at least one control end of the first selector is configured to receive the first temperature signal or the second temperature signal; and a second selector, wherein a first input end of the second selector is coupled to the voltage generation module and is configured to receive the first voltage, a second input of the second selector is coupled to an output end of the first selector, at least one control end of the second selector is configured to receive the operation command.

8. The pre-charge voltage generation circuit according to claim 7, wherein the first selector is configured to select and output, in response to the first temperature signal, the second voltage to the second input end of the second selector; the second selector is configured to select and output, in response to the write command, the second voltage as the voltage of the first end of the at least one storage capacitor; the voltage at the other end of the at least one storage capacitor is the array voltage when the write command is writing 1, and the amount of charges written to the at least one storage capacitor is determined based on the voltage difference between the array voltage and the second voltage.

9. The pre-charge voltage generation circuit according to claim 7, wherein the first selector is configured to select and output, in response to the second temperature signal, the first voltage to the second input end of the second selector, the second selector is configured to output, in response to the write command, the first voltage as the voltage of the first end of the at least one storage capacitor.

10. The pre-charge voltage generation circuit according to claim 7, wherein the second selector is configured to select and output, in response to the read command, the first voltage as the voltage of the first end of the at least one storage capacitor.

11. The pre-charge voltage generation circuit according to claim 7, wherein the second selector is configured to select and output, in response to the pre-charge command, the first voltage as the pre-charge voltage and the voltage of the first end of the at least one storage capacitor.

12. The pre-charge voltage generation circuit according to claim 7, wherein, the second selector is configured to select and output, in response to the read command, the first voltage as the voltage of the first end of the at least one storage capacitor and configured to allow the bit line to share charges with the at least one storage capacitor in a charge share stage, thus the bit line is pulled to reach a third voltage, wherein the third voltage is determined by the voltage difference after data is written to the at least one storage capacitor and by the first voltage set for the first end.

13. The pre-charge voltage generation circuit according to claim 1, wherein the voltage generation module comprises:

a comparison unit, configured to provide a baseline voltage;

a first voltage providing unit, coupled to an output end of the comparison unit and configured to output the first voltage based on the baseline voltage; and a second voltage providing unit, coupled to the output end of the comparison unit and configured to output the second voltage based on the baseline voltage.

14. The pre-charge voltage generation circuit according to claim 13, wherein the comparison unit comprises:

a first amplifier, wherein a negative phase input end of the first amplifier is configured to receive a reference voltage;

a switch unit, wherein a control end of the switch unit is coupled to an output end of the first amplifier, a first end of the switch unit is configured to receive an operation voltage, and a second end of the switch unit is configured to output the baseline voltage;

an adjustment unit, wherein a first end of the adjustment unit is coupled to the second end of the switch unit, a second end of the adjustment unit is coupled to an in-phase input end of the first amplifier.

15. The pre-charge voltage generation circuit according to claim 14, wherein the first voltage providing unit comprises:

a first resistor, wherein a first end of the first resistor is coupled to the first end of the adjustment unit;

a second resistor, wherein a first end of the second resistor is coupled to a second end of the first resistor;

a second amplifier, wherein an in-phase input end of the second amplifier is coupled to a coupling point between the first resistor and the second resistor, an output end of the second amplifier is coupled to a negative phase input end of the second amplifier, an output end of the second amplifier is configured to output the first voltage.

16. The pre-charge voltage generation circuit according to claim 15, wherein the second voltage providing unit comprises:

a third resistor, wherein a first end of the third resistor is coupled to a second end of the second resistor; and a third amplifier, wherein an in-phase input end of the third amplifier is coupled to a coupling point between the second resistor and the third resistor, an output end of the third amplifier is coupled to a negative phase input end of the third amplifier, and an output end of the third amplifier is configured to output the second voltage.

17. The pre-charge voltage generation circuit according to claim 16, wherein a sum of a resistance value of the third resistor and a resistance value of the second resistor is equal to a resistance value of the first resistor.

18. A random memory, comprising a pre-charge voltage generation circuit, wherein the pre-charge voltage generation circuit comprises:

a voltage generation module, configured to generate a first voltage and a second voltage, wherein the first voltage or the second voltage is configured to serve as a pre-charge voltage, and the first voltage is greater than the second voltage; and a selection module, coupled to the voltage generation module, wherein the selection module is configured to select and output, in response to an operation command being a write command, the second voltage as a voltage of a first end of at least one storage capacitor of the random memory, and is configured to select and output, in response to the operation command being a read command, the first voltage as the voltage of the first end, the selection module is configured to select and output, in response to the operation command being the write command and in response to a first temperature signal, the second voltage as the voltage of the first end of the at least one storage capacitor; and for each of the at least one storage capacitor, a voltage at the other end of the storage capacitor is an array voltage when the write command is writing 1, and the amount of charges written to the storage capacitor is determined based on a voltage difference between the array voltage and the second voltage, wherein the selection module is configured to select and output, in response to the operation command being the write command and in response to a second temperature signal, the first voltage as the voltage of the first end of the at least one storage capacitor, wherein a temperature corresponding to the second temperature signal is less than a temperature corresponding to the first temperature signal.

* * * * *